(12) United States Patent
Wei et al.

(10) Patent No.: US 9,543,328 B2
(45) Date of Patent: Jan. 10, 2017

(54) METAL OXIDE TFT DEVICE AND METHOD FOR MANUFACTURING THE SAME

(71) Applicant: SHENZHEN ROYOLE TECHNOLOGIES CO., LTD., Shenzhen (CN)

(72) Inventors: Peng Wei, Shenzhen (CN); Xiaojun Yu, Shenzhen (CN); Zihong Liu, Shenzhen (CN)

(73) Assignee: SHENZHEN ROYOLE TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 14/731,081

(22) Filed: Jun. 4, 2015

(65) Prior Publication Data
US 2015/0270290 A1    Sep. 24, 2015

Related U.S. Application Data

(63) Continuation-in-part of application No. PCT/CN2012/085792, filed on Dec. 4, 2012.

(51) Int. Cl.
*H01L 27/12* (2006.01)
*H01L 29/66* (2006.01)
(Continued)

(52) U.S. Cl.
CPC ....... *H01L 27/1225* (2013.01); *H01L 21/0272* (2013.01); *H01L 21/467* (2013.01);
(Continued)

(58) Field of Classification Search
CPC .................................................. H01L 27/1288
See application file for complete search history.

(56) References Cited

U.S. PATENT DOCUMENTS 4,788,157 A * 11/1988 Nakamura ........ H01L 29/41733
148/DIG. 1
2010/0264410 A1    10/2010 Nomoto et al.
(Continued)

FOREIGN PATENT DOCUMENTS

CN        102122620        7/2011
CN        102130009        7/2011
(Continued)

OTHER PUBLICATIONS

English language translation of International Search Report for PCT/CN2012/085792 dated Sep. 12, 2013 (6 pages total).

*Primary Examiner* — Benjamin Sandvik
(74) *Attorney, Agent, or Firm* — Hamre, Schumann, Mueller & Larson, P.C.

(57) ABSTRACT

A method for manufacturing a metal oxide TFT device is provided. The method includes: selecting a substrate and forming a gate electrode on a first side of the substrate; sequentially depositing an insulating layer, a semiconductor layer, and a photoresist layer on the gate electrode; using the gate electrode as a photomask, exposing from a second side of the substrate and reserving the photoresist layer aligning to the gate electrode; depositing an electrode layer on the semiconductor layer and the reserved photoresist layer; stripping the reserved photoresist layer and lifting off the electrode layer stacked on the reserved photoresist layer; etching a part of the reserved electrode layer and the semiconductor layer, and forming a source electrode, a drain electrode, and a semiconductor island. The method realizes a self-alignment using the gate electrode as the photomask when forming the source, drain electrodes and the channel. Therefore, the manufacturing processes become simple and more accurate.

4 Claims, 12 Drawing Sheets

(51) Int. Cl.
    *H01L 29/786*     (2006.01)
    *H01L 21/467*     (2006.01)
    *H01L 21/4763*     (2006.01)
    *H01L 29/417*     (2006.01)
    *H01L 29/423*     (2006.01)
    *H01L 21/027*     (2006.01)

(52) U.S. Cl.
    CPC ...... *H01L 21/47635* (2013.01); *H01L 27/124* (2013.01); *H01L 27/1255* (2013.01); *H01L 27/1259* (2013.01); *H01L 27/1288* (2013.01); *H01L 29/41733* (2013.01); *H01L 29/41775* (2013.01); *H01L 29/42356* (2013.01); *H01L 29/66969* (2013.01); *H01L 29/7869* (2013.01)

(56) References Cited

U.S. PATENT DOCUMENTS

| | | | | |
|---|---|---|---|---|
| 2011/0012106 | A1* | 1/2011 | Yamazaki | H01L 27/1225 257/43 |
| 2011/0049511 | A1* | 3/2011 | Yano | H01L 29/7869 257/43 |
| 2011/0240988 | A1* | 10/2011 | Yano | H01L 29/78609 257/43 |
| 2012/0138926 | A1* | 6/2012 | Qin | G01R 31/2884 257/48 |
| 2015/0303308 | A1* | 10/2015 | Wei | H01L 29/7869 257/43 |

FOREIGN PATENT DOCUMENTS

| | | |
|---|---|---|
| CN | 102723269 | 10/2012 |
| CN | 102738007 | 10/2012 |
| CN | 102768992 | 11/2012 |

* cited by examiner

METAL OXIDE TFT DEVICE AND METHOD FOR MANUFACTURING THE SAME

CROSS REFERENCES OF RELATED APPLICATION

This application is a Continuation-In-Part of International Patent Application No. PCT/CN2012/085792, file on Dec. 4, 2012, which is hereby incorporated by reference in its entirety.

TECHNICAL FIELD

The disclosure relates to the field of semiconductor technology, and more particularly, to a metal oxide thin film transistor (TFT) device, a pixel circuit including the metal oxide TFT device, a method for manufacturing the metal oxide TFT device, and a method for manufacturing the pixel circuit.

BACKGROUND

Metal oxide TFTs are components widely used in basic circuits of various electronic systems. The metal oxide TFTs have many advantages, such as high carrier mobility, low processing temperatures, high stability, high transparency, etc. FIG. 1 depicts a typical bottom-gate TFT device 1. In a conventional process of manufacturing the bottom-gate TFT device 1, in order to form a source electrode 102 and a drain electrode 103 of the bottom-gate TFT device 1, a conductive layer and a photoresist layer (not shown) are sequentially formed on a gate electrode 101 via a gate insulation layer 104 and a semiconductor layer 105. The photoresist layer is exposed via a photomask (not shown) disposed above the photoresist layer and then is developed to form a patterned photoresist layer. Further, a part of the conductive layer is etched according to the patterned photoresist layer. Accordingly, the rest of the conductive layer remained on the semi-conductive layer 105 are respectively used to form the source electrode 102 and the drain electrode 103.

However, due to the limited exposure accuracy in photolighography and a misalignment between the photomask and the bottom-gate TFT device 1 may occur, overlaps are generally formed between the gate electrode 101 and the source, drain electrodes 102, 103 resulting in generating a gate-source parasitic capacitance (Cgs) and a gate-drain parasitic capacitance (Cgd). The gate-source parasitic capacitance and the gate-drain parasitic capacitance have a poor influence (impact) to a work performance of a pixel circuit (not shown) including the bottom-gate TFT device 1. Accordingly, an electronic device employed the bottom-gate TFT device 1 may have a poor image quality, including image flicker and sticking.

What is needed, therefore, is a metal oxide TFT device, a method of manufacturing the metal oxide TFT device, a pixel circuit, and a method of manufacturing the pixel circuit which can overcome the described limitations.

SUMMARY

The present disclosure aims at providing a method for manufacturing a metal oxide TFT device, to solve the problem that the conventional method is apt to generate parasitic capacitances and has complex manufacturing processes.

The present disclosure provides a method for manufacturing a metal oxide TFT device. The method includes:

selecting a substrate and forming a gate electrode on a first side of the substrate;

sequentially disposing an insulating layer, a semiconductor layer, and a photoresist layer on the gate electrode;

using the gate electrode as a photomask, exposing from a second side of the substrate that opposes to the first side, and reserving a part of the photoresist layer that aligns to the gate electrode;

depositing an electrode layer on the semiconductor layer and the reserved photoresist layer;

stripping the reserved photoresist layer and lifting off a part of the electrode layer that is stacked on the photoresist layer, so as to expose a channel of the semiconductor layer aligning to the gate electrode, and reserving other parts of the electrode layer; and etching a part of the reserved electrode layer and the semiconductor layer, and forming a source electrode, a drain electrode, and a semiconductor island.

Another purpose of the present disclosure is to provide a metal oxide TFT device. The metal oxide TFT device includes:

a substrate;

a gate electrode and an insulating layer, sequentially stacked on the substrate;

a metal oxide semiconductor island having a channel, disposed on the insulating layer; and a source electrode and a drain electrode, disposed on the metal oxide semiconductor island, with the channel of the metal oxide semiconductor island located between the source electrode and the drain electrode and aligning to the gate electrode.

A further purpose of the present disclosure is to provide a method for manufacturing a pixel circuit including a metal oxide TFT device and a storage capacitor. The method including:

selecting a substrate and forming a gate, a gate line, and a first storage capacitor electrode on a first side of the substrate;

sequentially disposing an insulating layer, a metal oxide semiconductor layer, and a photoresist layer on the gate electrode, the gate line, the first storage capacitor electrode, and the first side of the substrate;

using the gate electrode, the gate line, and the first storage capacitor electrode as photomasks, exposing from a second side of the substrate that oppose the first side, and reserving parts of the photoresist layer that align to the gate electrode, the gate line, and the first storage capacitor electrode;

depositing an electrode layer on the metal oxide semiconductor layer and the reserved photoresist layer;

stripping the reserved photoresist layer and parts of the electrode layer that are stacked on the reserved photoresist layer, exposing parts of the metal oxide semiconductor layer that align to the gate electrode, the gate line, and the first storage capacitor electrode, and reserving other parts of the electrode layer; and etching a part of the reversed electrode layer and the metal oxide semiconductor layer, and forming a source electrode, a drain electrode, and a metal oxide semiconductor island.

A further purpose of the present disclosure is to provide a pixel circuit. The pixel circuit includes:

a substrate;

a gate electrode, a gate line, and a first storage capacitor electrode which are disposed on the substrate in a coplane manner;

an insulating layer, disposed on the gate, the gate line, the first storage capacitor electrode, and the substrate;

a metal oxide semiconductor island having a channel, stacked on the gate electrode via the insulating layer; and a source electrode and a drain electrode, disposed on the metal oxide semiconductor island, with the channel of the metal oxide semiconductor island located between the source electrode and the drain electrode and aligning to the gate electrode.

In the present disclosure, the bottom gate electrode is used as the photomask, the position where the photoresist layer covers the channel is determined through one exposure from the second side of the substrate, and an alignment between the gate and the source, drain electrodes is achieved by combining with a manner of stripping the photoresist layer aligned to the gate electrode. The manufacturing process is simple and the alignment accuracy is high. A misalignment offset between the gate electrode and the source, drain electrodes becomes small, and a sum of widths of overlapping regions between the gate electrode and the source, drain electrodes may be precisely limited to less than 2 μm, and thus alignment accuracy becomes higher. Accordingly, parasitic capacitances formed between the gate electrode and the source, drain electrodes are reduced, an operating speed of the metal oxide TFT device is increased, a size of the channel is minimized and becomes more accurate, and thus, a performance of the metal oxide TFT device is improved.

In addition, because the source and the drain electrodes are formed by stripping the photoresist layer aligned to the gate electrode together with the electrode layer on the photoresist layer, there is no need to prepare an etch stop layer, and only one exposure from the second side is needed, thereby simplifying the manufacturing process, reducing the number of the use of photomasks, improving the manufacturing efficiency, and avoiding adverse effects of the etch stop layer to the channel.

Furthermore, the source, drain electrodes don't need use transparent materials, and thus, the optionality of the materials for the source, drain electrodes is greatly increased. In addition, the manufacturing difficulty is reduced because the gate electrode 12 itself acts as a photomask.

BRIEF DESCRIPTION OF DRAWINGS

FIGS. 3-1 to 3-11 are schematic structural views of the metal oxide TFT device in accordance with different manufacturing steps shown in FIG. 2.

FIG. 4 is a schematic structural view of a metal oxide TFT device according to an exemplary embodiment of the present disclosure.

FIG. 5 is a flowchart showing a method for manufacturing a pixel circuit including a metal oxide TFT device according to an exemplary embodiment of the present disclosure.

FIGS. 6-1 to 6-11 are schematic structural views of the pixel circuit including the metal oxide TFT device in accordance with different manufacturing steps shown in FIG. 5.

DETAILED DESCRIPTION

To make the objects, features and advantages of the disclosure described above more obvious and easy to be understood, in the following, particular embodiments of the disclosure are illustrated in detail in conjunction with drawings. It should be understood that, the described embodiments are only used to explain the disclosure, but not to limit the disclosure.

The specific implementations of the present disclosure are illustrated in detail in conjunction with the particular embodiments.

Figure 1:
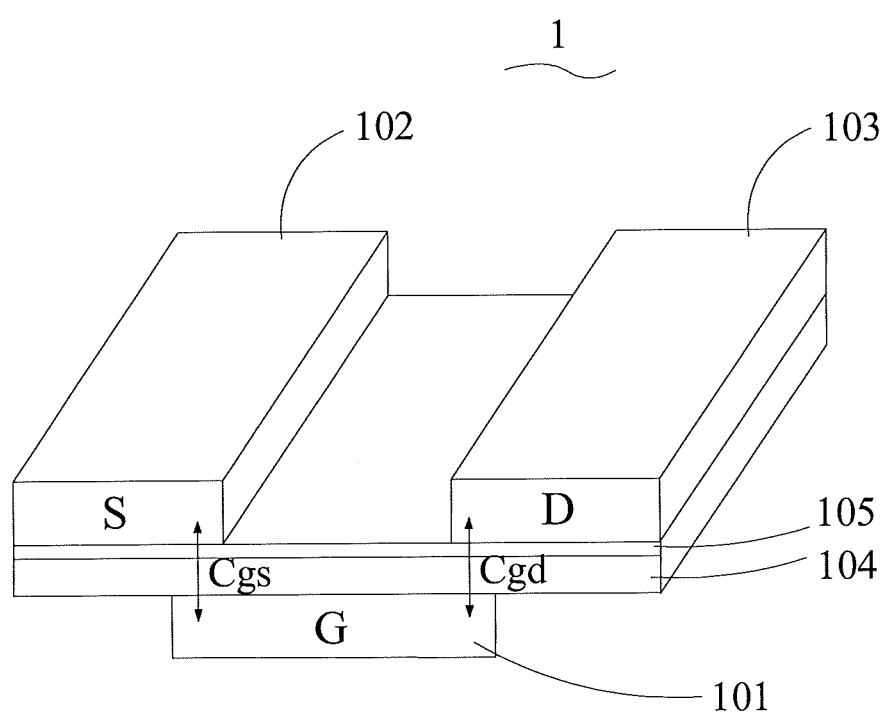
FIG. 1 is a schematic structural view of a conventional metal oxide TFT device.
Figure 2:
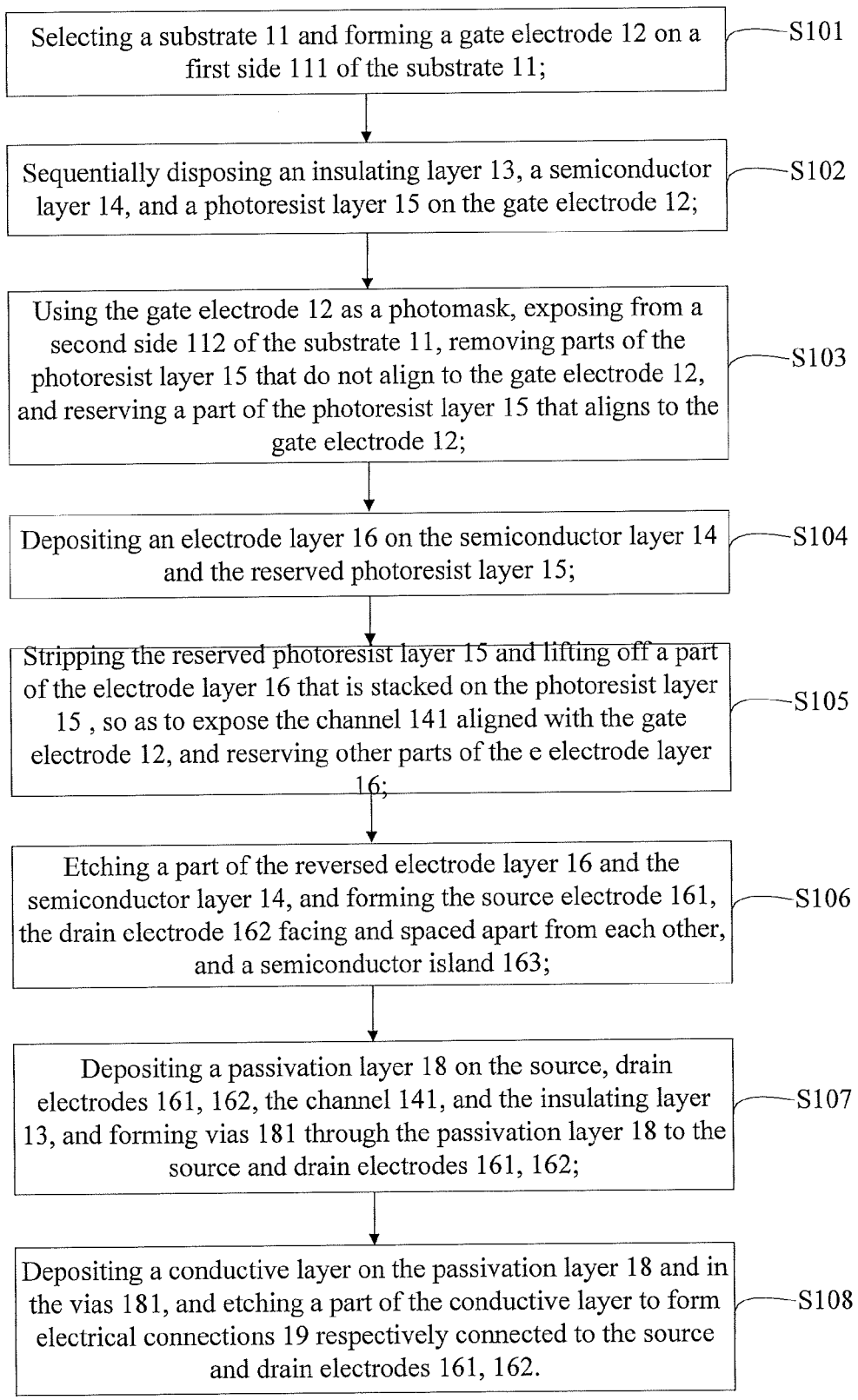
FIG. 2 is a flowchart showing a method for manufacturing a metal oxide TFT device according to an exemplary embodiment of the present disclosure.

FIG. 2 shows a flowchart showing a method for manufacturing a metal oxide TFT device 2 according to an exemplary embodiment of the present disclosure. FIGS. 3-1 to 3-11 show the metal oxide TFT device 2 in accordance with different manufacturing steps shown in FIG. 2. For convenience, only parts related to this embodiment is shown.

As shown in FIG. 2, the manufacturing method includes steps as follows.

Figures 1, 3:
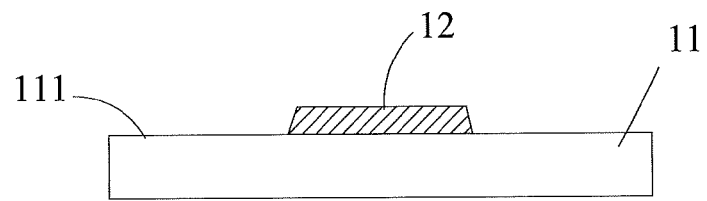
Figures 2, 3:
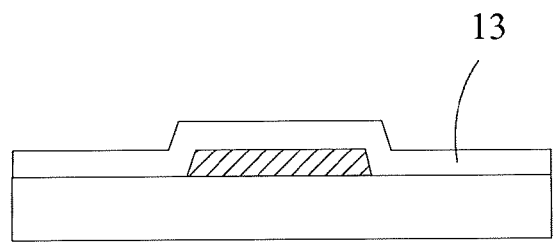
Figure 3:
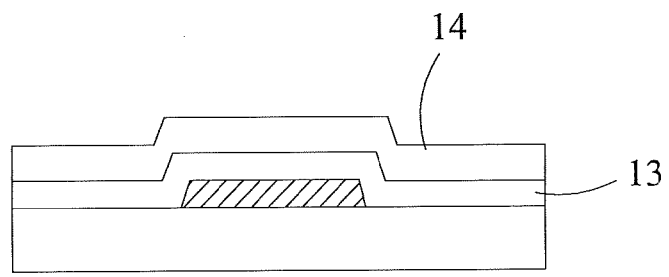

Step S101, selecting a substrate 11 and forming a gate electrode 12 on a first side 111 of the substrate 11, as shown in FIG. 3-1.

In the step S101, the substrate 11 may be made of a material that is transparent to the light used in a photolithography process, for example. Then, a first photomask (not shown) is used to pattern a conductive layer to form the gate electrode 12. Optionally, a buffer layer (not shown) may be omitted or added between the gate electrode 12 and substrate 11.

Figures 3, 4:
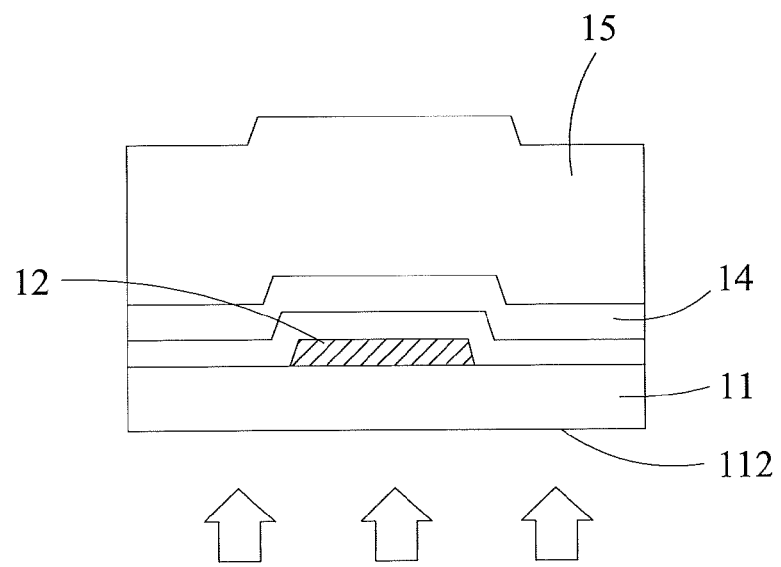

Step S102, sequentially disposing an insulating layer 13, a semiconductor layer 14, and a photoresist layer 15 on the gate electrode 12, as shown in FIGS. 3-2, 3-3, 3-4.

Figures 3, 4, 5:
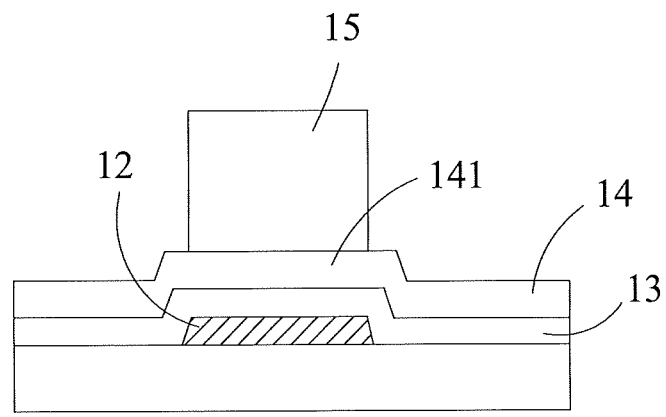

In the step S102, the insulating layer 13 is deposited on the substrate 11 and the gate electrode 12 firstly, as shown in FIG. 3-2. Then, the semiconductor layer 14 is deposited on the insulating layer 13, as shown in FIG. 3-3. The semiconducitve layer 14 is made from metal oxide semiconductor. Some typical examples of transparent metal oxides include ZnO, InO, AlZnO, ZnInO, InAlZnO, InGaZnO, ZnSnO, GaSnO, InGaCuO, InCuO, AlCuO, etc. A part of the semiconductor layer 14 that is aligned to the gate electrode 12 is used as a channel 141 as shown in FIG. 3-5. The channel 141 is configured to transmit carries between a source electrode 161 and a drain electrode 162 of the metal oxide TFT device 2, as shown in FIG. 3-8. After the semiconductor layer 14 is formed, a photoresist layer 15 is coated on the semiconductor layer 14, and is to be used in a subsequent photolithography process, as shown in FIG. 3-4.

Step S103, using the gate electrode 12 as a photomask, exposing from a second side 112 of the substrate 11, removing parts of the photoresist layer 15 that do not align with the gate electrode 12, and reserving a part of the photoresist layer 15 on the top of the semiconductor layer 14 that aligns to the gate electrode 12, as shown in FIGS. 3-4, 3-5. The second side 112 opposes to the first side 111.

In the step S103, the gate electrode 12 is non-transparent, the substrate 11, the insulating layer 13, and the semiconductor layer 14 are transparent, therefore, the gate electrode 12 is capable of acting as a photomask. The part of the photoresist layer 15 aligning to the gate electrode 12 is not exposed in the photolithography step and the rest of the photoresist layer 15 not aligning to the gate electrode 12 are exposed when exposing from the second side 112 of the substrate 11 using the gate electrode 12 as the photomask. Then, a development process is implemented to remove the rest of the photoresist layer 15 not aligning to the gate electrode 12. Accordingly, the part of the photoresist layer 15 aligned to the gate electrode 12 are reserved on the semiconductor layer 14.

Step S104, depositing an electrode layer 16 on the semiconductor layer 14 and the reserved photoresist layer 15, as shown in FIG. 3-6a.

In the step S104, the electrode layer 16 may be a non-transparent metal electrode layer.

Furthermore, an electrode contact layer 17 may be deposited prior to the electrode layer 16. The electrode contact layer 17 is configured to reduce the contact resistance and increase the carrier injection efficiency, as shown in FIG. 3-6b. In alternative embodiments, the electrode contact layer may be omitted.

Step S105, stripping the reserved photoresist layer 15 and lifting off a part of the electrode layer 16 that is stacked on the photoresist layer 15 (shown in FIG. 3-6b), so as to expose the channel 141 aligned with the gate electrode 12, and reserving other parts of the e electrode layer 16, as shown in FIG. 3-7.

Step S106, etching a part of the reserved electrode layer 16 and the semiconductor layer 14 (shown in FIG. 3-7), and forming the source electrode 161, the drain electrode 162 facing and spaced apart from each other, and a semiconductor island 163, as shown in FIG. 3-8.

In the step S106, a second photomask 20 may be used to pattern the reserved electrode layer 16 and the semiconductor layer 14 to form the source electrode 161, the drain electrode 162, and the semiconductor island 163. A side of the source electrode 161 and a side of the drain electrode 162 that faces and opposes the side of the source electrode 161 may respectively align to two opposite sides of the gate electrode 12.

Step S107, depositing a passivation layer 18 on the source, drain electrodes 161, 162, the channel 141, and the insulating layer 13, and forming vias 181 through the passivation layer 18 to the source and drain electrodes 161, 162, as shown in FIGS. 3-9, 3-10.

In the step S107, a third photomask (not shown) may be used to pattern the passivation layer 18, and the passivation layer 18 is etched to form the vias 181.

Step S108, depositing a conductive layer on the passivation layer 18 and in the vias 181, and etching a part of the conductive layer to form electrical connections 19 respectively connected to the source and drain electrodes 161, 162.

In the step S108, a fourth photomask (not shown) may be used to pattern the conductive layer, and the conductive layer is etched to form the electrical connections 19.

After the above-described steps, the metal oxide TFT device 2 is manufactured. It should be understood that what is described above is only for illustrating the manufacturing process of the major structure of the metal oxide TFT device 2, the metal oxide TFT device may comprise other conventional function structures, and may be manufactured by the ordinary method, which is not described in the present disclosure.

In the present disclosure, the bottom gate electrode 12 acts as the photomask, the position where the photoresist layer 15 covers the semiconductor channel 141 is determined through one exposure from the second side 112 of the substrate 11, and the self-alignment between the gate electrode 12 and the source, drain electrodes 161, 162 is achieved by combining with a manner of stripping the photoresist layer 15 aligned to the gate electrode 12. The manufacturing process is simple and the alignment accuracy is high. A misalignment offset between the gate electrode 12 and the source, drain electrodes 161, 162 becomes small, and a sum of widths of overlapping regions between the gate electrode 12 and the source, drain electrodes 161, 162 may be precisely limited to less than 2 µm, and thus alignment accuracy becomes higher.

Accordingly, parasitic capacitances formed between the gate electrode 12 and the source, drain electrodes 161, 162 are reduced, an operating speed of the metal oxide TFT device 2 is increased, a size of the channel 141 is minimized and becomes more accurate, and thus, a performance of the metal oxide TFT device 2 is improved.

In addition, because the source and the drain electrodes 161, 162 are formed by stripping the photoresist layer 15 aligned to the gate electrode 12 together with the lifted off of the electrode layer on the photoresist layer 15, there is no need to prepare an etch stop layer, and only one exposure from the second side 112 is needed, thereby simplifying the manufacturing process, reducing the number of the use of photomasks, improving the manufacturing efficiency, and avoiding adverse effects of the etch stop layer to the channel 141.

Furthermore, the source and drain electrodes 161, 162 are not limited to use a transparent material, and thus, an optionality of materials for the source and drain electrodes 161, 162 is greatly increased. In addition, the manufacturing difficulty is reduced because the gate electrode 12 itself acts as a photomask.

Based on the above-mentioned method, an embodiment of the present disclosure provides the metal oxide TFT device 2 which is manufactured by the above-mentioned manufacturing method is disclosed as follows.

Referring to FIG. 4, the metal oxide TFT device 2 is a bottom gate TFT and includes a substrate 11, a gate electrode 12, an insulating layer 13, a semiconductor island 163 having a channel 141 thereon, a source electrode 161, a drain electrode 162, a passivation layer 18 having vias 181, and electrical connections 19.

The gate electrode 12 is disposed on the substrate 11. The insulating layer 13 is disposed on the gate electrode 12 and parts of the substrate 11 that is not covered by the gate electrode 12. The semiconductor island 163 is disposed on the insulating layer 13. The source electrode 161 and the drain electrode 162 are disposed on the semiconductor island 163, with the channel 141 located between the source electrode 161 and the drain electrode 162 and aligning to the gate electrode 12. A side of the source electrode 161 and a side of the drain electrode 162 that faces and opposes the side of the source electrode 161 may respectively align to two opposite sides of the gate electrode 12. The passivation layer 18 is disposed on the source, drain electrodes 161, 162, the channel 141 of the semiconductor island 163 located between the source, drain electrodes 161, 162, and the insulating layer 13, and includes vias 181 through the passivation layer 18. The electrical connections 19 are disposed on the passivation layer 18 and in the vias 181 and are connected the source, drain electrodes 161, 162 to an external circuit (not shown) via the vias 181. Furthermore, an electrode contact layer 17 may be alternatively disposed between the semiconductor island 163 and the source, drain electrodes 161, 162, to reduce a contact resistance and increase a carrier injection efficiency, and thus electrical characteristics of the metal oxide TFT device may be improved.

Furthermore, the source, drain electrodes 161, 162, and the channel 141 are formed in a self-alignment manner using the gate electrode 12 as a photomask, therefore, not only a misalignment offset between the gate electrode 12 and the source, drain electrodes 161, 162 becomes small, but also widths of overlapping regions between the gate electrode 12 and the source, drain electrodes 161, 162 may be reduced to less than 2 µm. Accordingly, parasitic capacitances respectively generated between the gate electrode 12 and the source, drain electrodes 161, 162 are effectively reduced, thereby improving a performance of the metal oxide TFT device 2.

It should be understood that the metal oxide TFT device 2 may also include other functional structures which are not described in the present disclosure, and all metal oxide TFT devices manufactured through the above-mentioned method fall within the protection scope of the present disclosure.

Embodiment Two

FIG. 5 shows a flowchart showing a method for manufacturing a pixel circuit 3 including a metal oxide TFT 4 and a storage capacitor 5 according to an exemplary embodiment of the present disclosure. FIGS. 6-1 to 6-11 show schematic structural views of the pixel circuit in accordance with different manufacturing steps shown in FIG. 5, for convenience, only parts related to this embodiment is shown.

As shown in FIG. 5, the manufacturing method includes steps as follows.

Figures 3, 4, 5, 6, 6A:
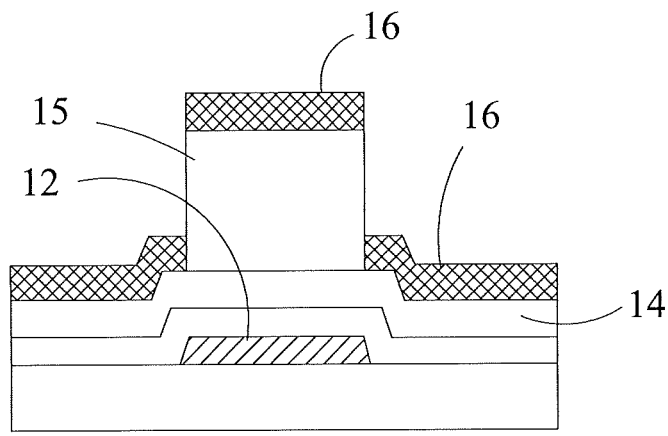

Step S201, selecting a substrate 21 and forming a gate electrode 221, a gate line 222, and a storage capacitor electrode 223 on a first side 211 of the substrate 21, as shown in FIG. 6-1.

In the step S201, the substrate 21 may be made of a material that is transparent to the light used in a photolithography process, for example. Then, a first photomask (not shown) is used to pattern a metal layer to form the gate electrode 221, the gate line 222, and the first storage capacitor electrode 223. Optionally, a buffer layer may be omitted or added between the substrate 21 and the gate electrode 221.

Step S202, sequentially disposing an insulating layer 23, a semiconductor layer 24, and a photoresist layer 25 on the gate electrode 221, the gate line 222, and the first storage capacitor electrode 223, as shown in FIGS. 6-2, 6-3, 6-4.

In the step S202, the insulating layer 23 is firstly deposited on the substrate 21 and the gate electrode 221, the gate line 222, and the first storage capacitor electrode 223, as shown in FIG. 6-2. Then the semiconductor layer 24 is deposited on the insulating layer 23, as shown in FIG. 6-3. The semiconducitve layer 24 is made from metal oxide semiconductor. Some typical examples of transparent metal oxides include ZnO, InO, AlZnO, ZnInO, InAlZnO, InGaZnO, ZnSnO, GaSnO, InGaCuO, InCuO, AlCuO, etc. A part of the semiconductor layer 24 that is aligned to the gate electrode 221 is used as a channel 241 as shown in FIG. 6-5. The channel 241 is configured to transmit carries between a source electrode 261 and a drain electrode 262 of the metal oxide TFT device, as shown in shown in FIG. 6-8. After the semiconductor layer 24 is formed, a photoresist layer 25 is coated on the semiconductor layer 24, and is to be used in a subsequent photolithography process, as shown in FIG. 6-4.

Step S203, using the gate electrode 221, the gate line 222, and the first storage capacitor electrode 223 as photomasks, exposing from a second side 212 of the substrate 21, removing parts of the photoresist layer 25 that do not align with the gate electrode 221, the gate line 222, and the first storage capacitor electrode 223, and reserving other parts of the photoresist layer 25 on the top of the semiconductor layer 24 that align to the gate electrode 221, the gate line 222, and the first storage capacitor electrode 223, as shown in FIGS. 6-4, 6-5. The second side 212 opposes to the first side 211.

In the Step S203, the gate electrode 221, the gate line 222, and the first storage capacitor electrode 223 are non-transparent, the substrate 21, the insulating layer 23, and the semiconductor layer 24 are transparent, and therefore, the gate electrode 221, the gate line 222, and the first storage capacitor electrode 223 are capable of acting as the photomasks. Parts of the photoresist layer 25 respectively aligning to the gate electrode 221, the gate line 222, and the first storage capacitor electrode 223 are not exposed and other parts of the photoresist layer 25 are exposed when exposing from the second side 212 of the substrate 21 using the gate electrode 221, the gate line 222, and the first storage capacitor electrode 223 as the photomasks. Then, a development process is implemented to remove the parts of the photoresist layer 25 that are exposed. Accordingly, the parts of the photoresist layer 25 aligned to the gate electrode 12 are reserved on the semiconductor layer 24.

Step S204, depositing an electrode layer 26 on the semiconductor layer 24 and the reserved photoresist layer 25, as shown in FIG. 6-6a.

In the Step S204, the electrode layer 26 may be a non-transparent metal electrode layer.

Figures 3, 4, 5, 6, 6B:
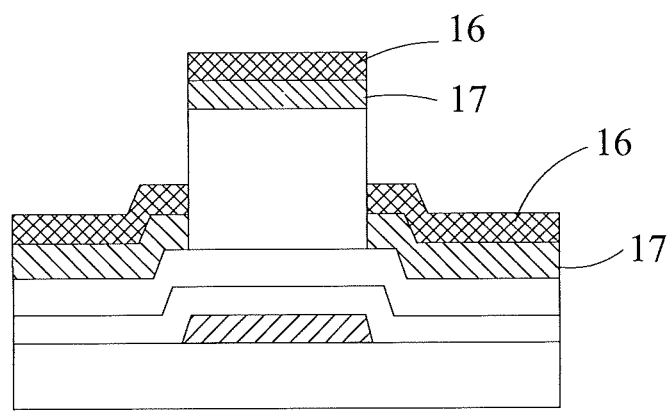

Furthermore, an electrode contact layer 27 may be deposited prior to the electrode layer 26. The electrode contact layer 27 is configured to reduce the contact resistance and increase the carrier injection efficiency, as shown in FIG. 6-6b. In alternative embodiments, the electrode contact layer 27 may be omitted.

Figures 3, 4, 5, 6, 7:
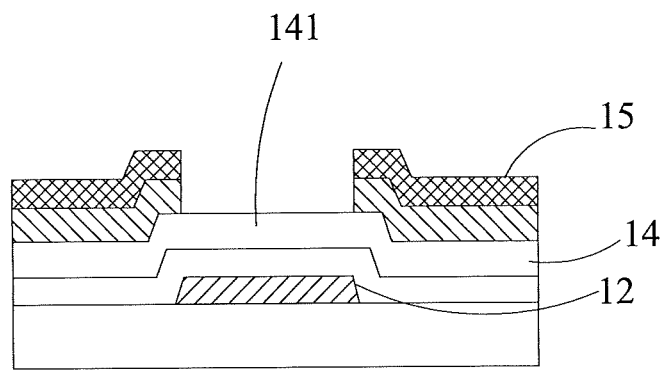

Step S205, stripping the reserved photoresist layer 25 and lifting off parts of the electrode layer 26 that are stacked on the reserved photoresist layer 25 (shown in FIG. 6-6b), so as to expose parts of the semiconductor layer 24 that align to the gate electrode 221, the gate line 222, and the first storage capacitor electrode 223, and reserving other parts of the electrode layer 26, as shown in FIG. 6-7.

Figures 3, 4, 5, 6, 7, 8:
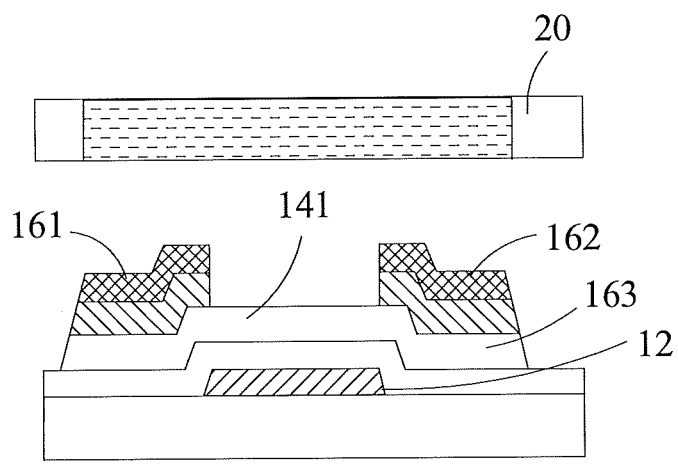
Figures 3, 4, 5, 6, 7, 8, 9:
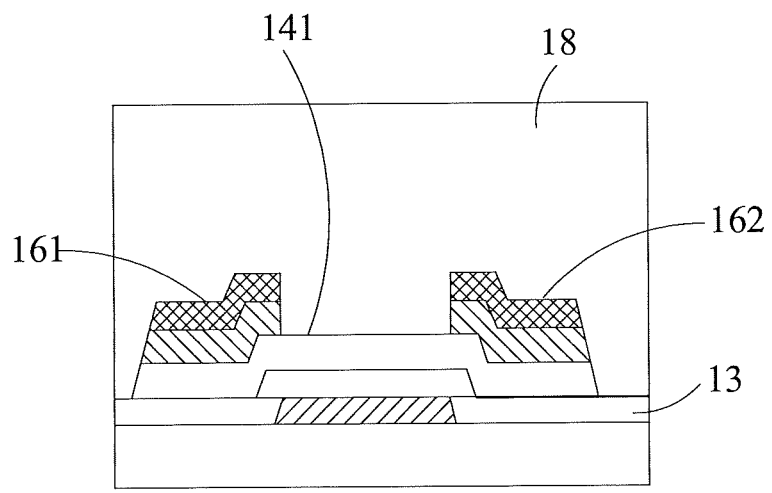
Figures 3, 4, 5, 6, 7, 8, 9, 10:
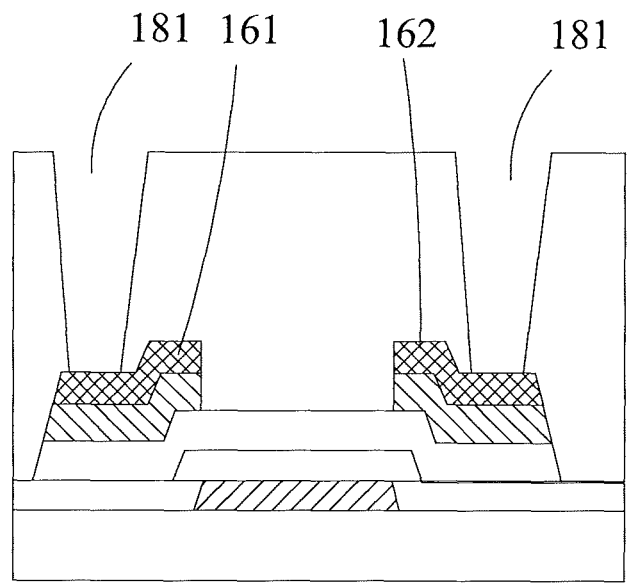
Figures 3, 4, 5, 6, 7, 8, 9, 10, 11:
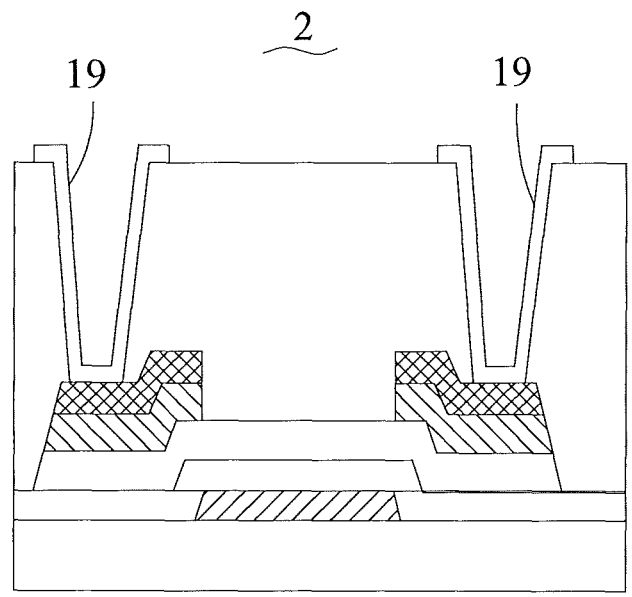
Figure 4:
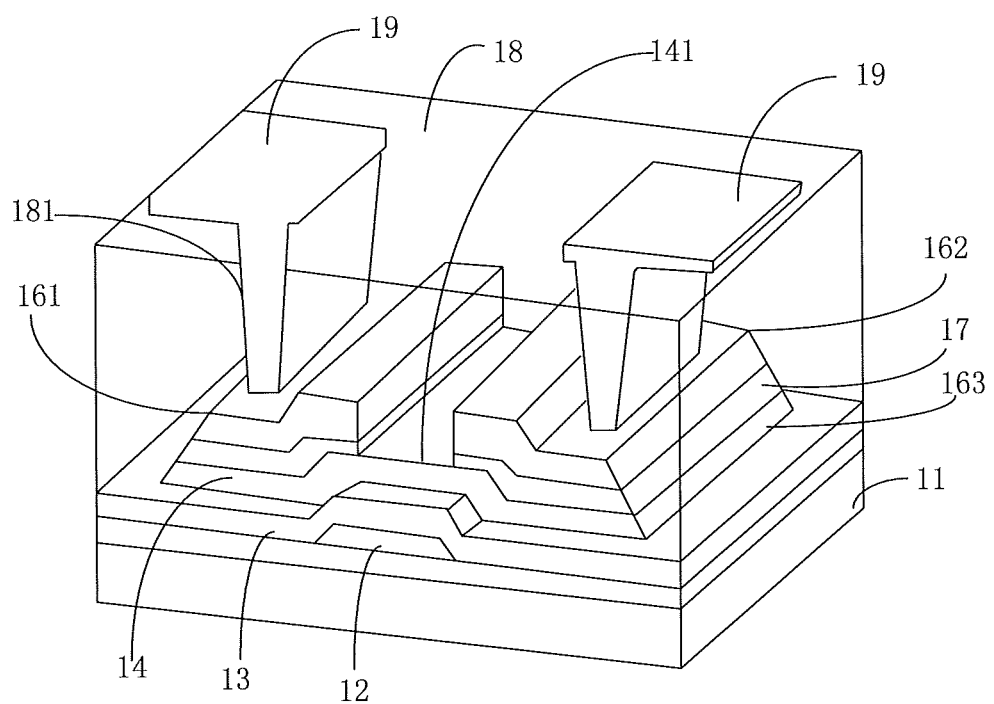
Figure 5:
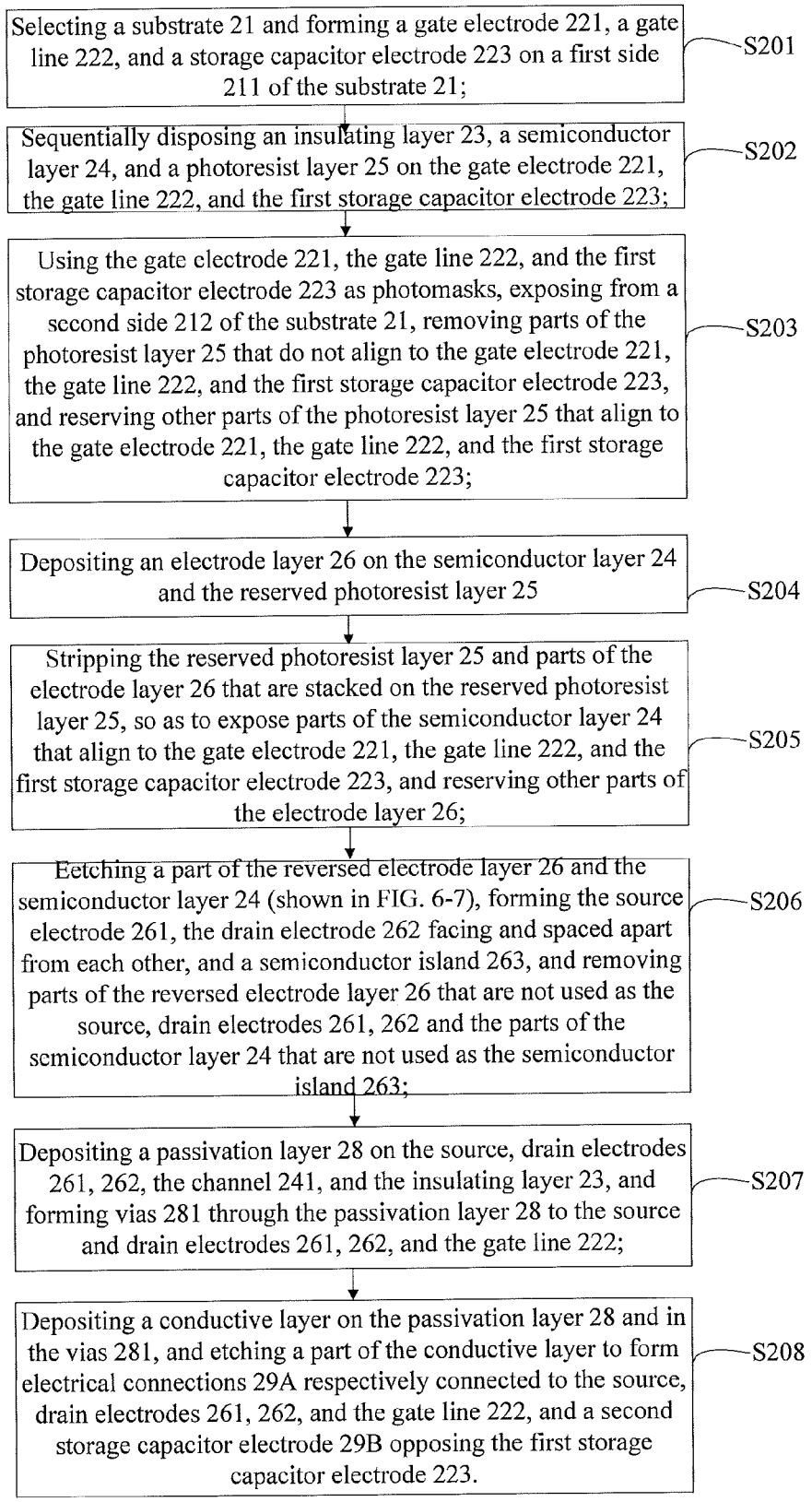
Figures 1, 6:
Figures 2, 6:
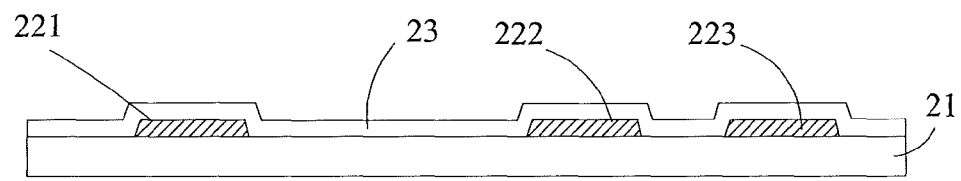
Figures 3, 6:
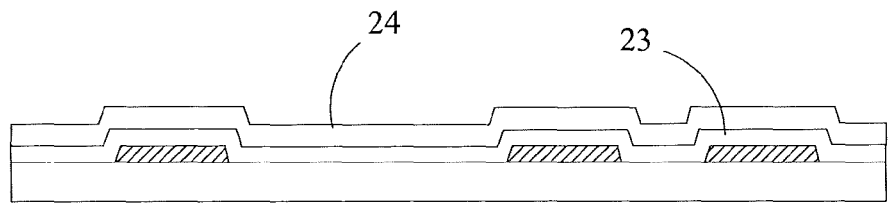
Figures 4, 6:
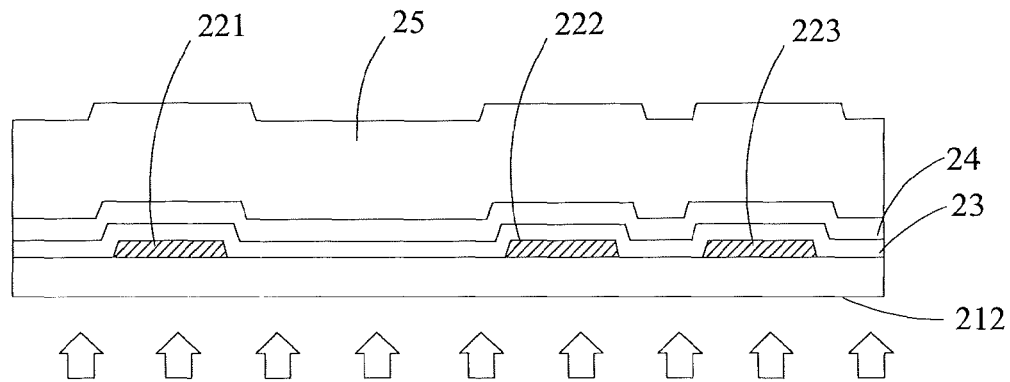
Figures 5, 6:
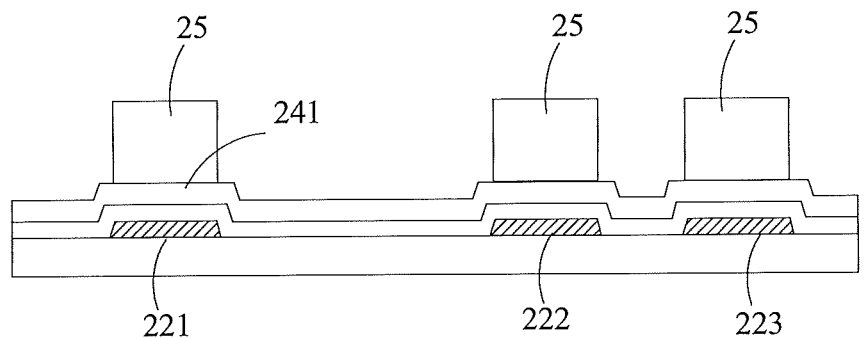
Figures 6, 6A:
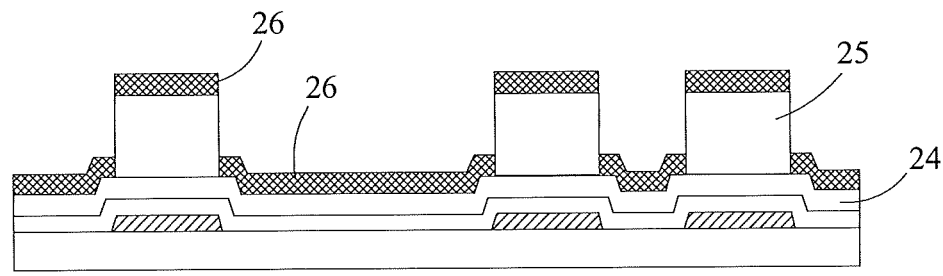
Figures 6, 6B:
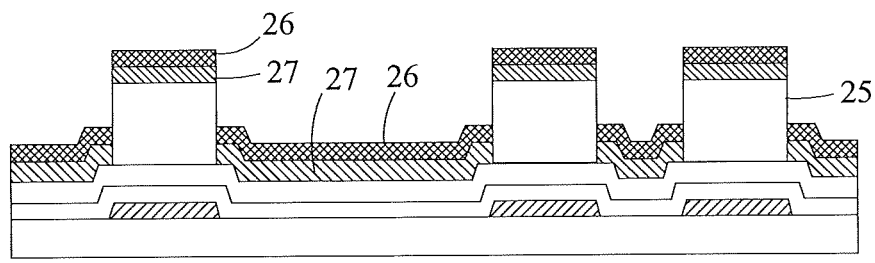
Figures 6, 7:
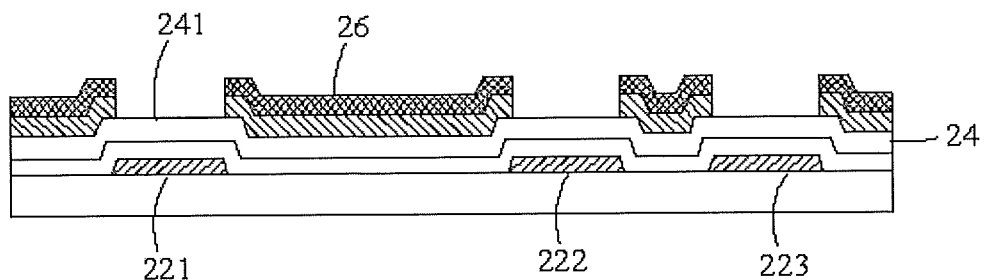
Figures 6, 7, 8:
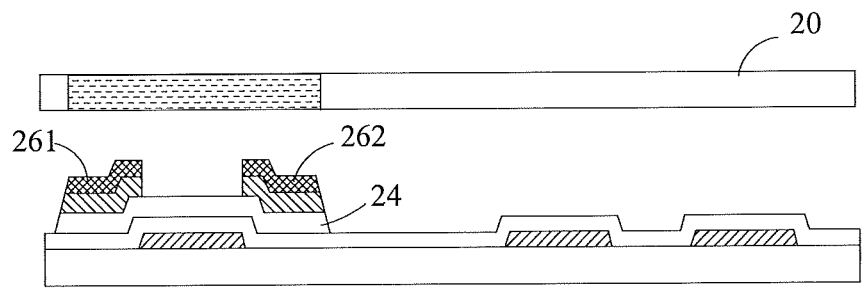
Figures 6, 7, 8, 9:
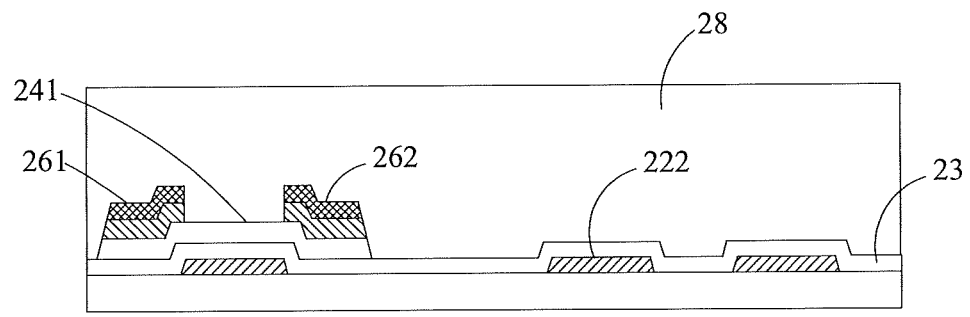
Figures 6, 7, 8, 9, 10:
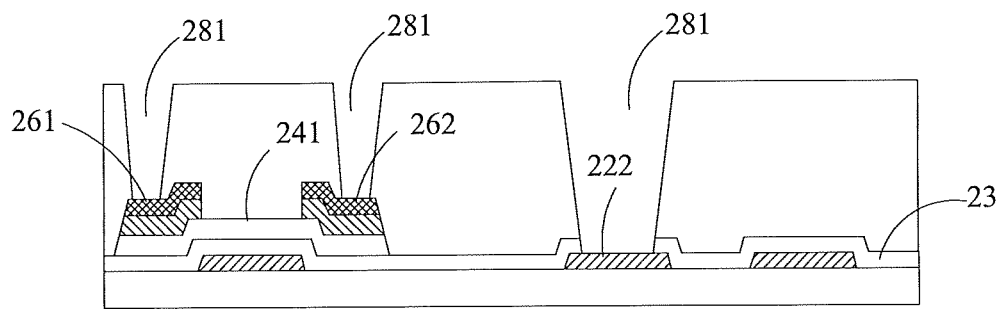
Figures 6, 7, 8, 9, 10, 11:
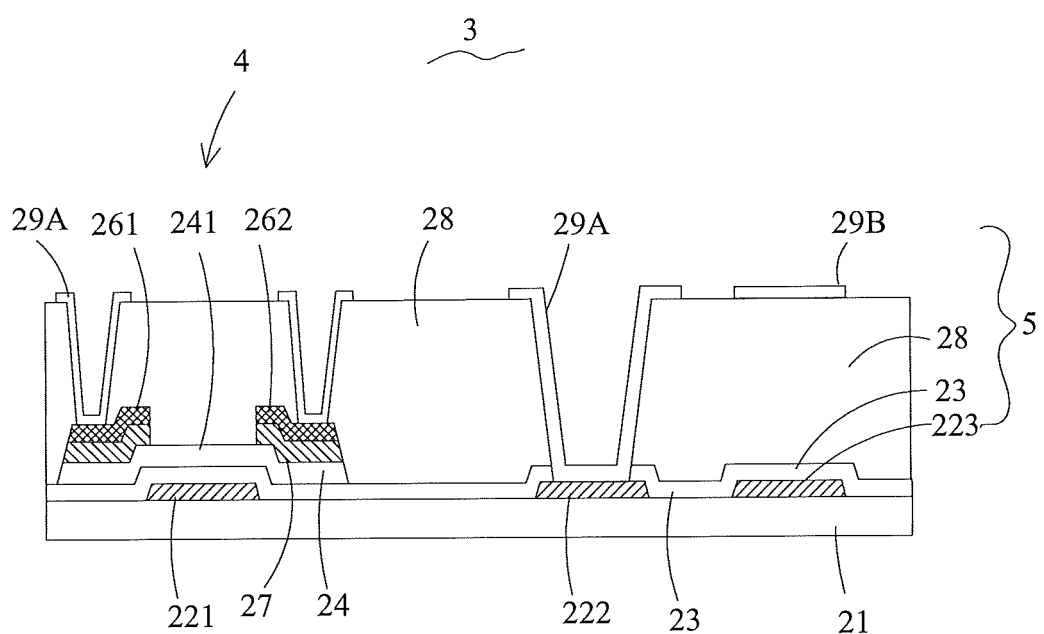

Step S206, etching a part of the reversed electrode layer 26 and the semiconductor layer 24 (shown in FIG. 6-7), forming the source electrode 261, the drain electrode 262 facing and spaced apart from each other, and a semiconductor island 263, and removing parts of the reversed electrode layer 26 that are not used as the source, drain electrodes 261, 262 and the parts of the semiconductor layer 24 that are not used as the semiconductor island 263, as shown in FIG. 6-8. In the step S206, a second photomask 30 may be used to pattern the reserved electrode layer 26 and the semiconductor layer 24 to form the source electrode 261, the drain electrode 262, and the semiconductor island 263. A side of the source electrode 261 and a side of the drain electrode 262 that faces and opposes the side of the source electrode 261 may respectively align with two opposite sides of the gate electrode 221.

Step S207, depositing a passivation layer 28 on the source, drain electrodes 261, 262, the channel 241, and the insulating layer 23, and forming vias 281 through the passivation layer 28 to the source and drain electrodes 261, 262, and the gate line 222, as shown in FIGS. 6-9, 6-10.

In this step S207, a third photomask (not shown) may be used to pattern the passivation layer 28, and the passivation layer 28 is etched to form the vias 281.

Step S208, depositing a conductive layer on the passivation layer 28 and in the vias 281, and etching a part of the conductive layer to form electrical connections 29A respectively connected to the source, drain electrodes 261, 262, and the gate line 222, and a second storage capacitor electrode 29B opposing the first storage capacitor electrode 223.

In the step S208, a fourth photomask (not shown) may be used to pattern the conductive layer, and the conductive layer is etched to form the electrical connections 29A and the second storage capacitor electrode 29B. The first storage capacitor electrode 223, the insulating layer 23, the passivation layer 28, and the second storage capacitor electrode 29B cooperatively define the storage capacitor 5. The storage capacitor 5 is configured to storage electric charges. The gate electrode 221, the insulating layer 23, the semiconductor island 24, the source, drain electrodes 261, 262 cooperatively defines the metal oxide TFT device 4. The metal oxide TFT device 4 may further includes the passivation layer 28 and the electrical connections 29A. The metal oxide TFT device 4 may be configured to drive a display device of an electronic device (not shown) to display images, for example. It should be understood that what is described above is only for illustrating the manufacturing process of the major structure of the pixel circuit, the pixel circuit may comprise other conventional function structures, and may be manufactured by the ordinary method, which is not described in the present disclosure.

In the present disclosure, since the bottom gate electrode 221, the gate line 222 and the first storage capacitor electrode 223 are used as the photomasks, the source, drain electrodes 261, 262, and the channel 241 are manufactured in a self-alignment manner. This method has the same effect with the above embodiment, and thus, the effect here does not be described in this embodiment.

An embodiment of the present disclosure provides the pixel circuit 3 including the metal oxide TFT 4 and the storage capacitor 5 which is manufactured by the above-mentioned manufacturing method.

Referring to FIG. 6-11, the pixel circuit 3 includes a substrate 21, a gate electrode 221, a gate line 222, a first storage capacitor electrode 223, an insulating layer 23, a semiconductor island 24 having a channel 241 thereon, a source electrode 261, a drain electrode 262, a passivation layer 28 having vias 281, electrical connections 29A, and a second storage capacitor electrode 29B.

The gate electrode 221, the gate line 222, and the first storage capacitor electrode 223 are disposed on the substrate 21 in a coplane manner. The insulating layer 23 is disposed on the gate electrode 221, the gate line 222, the first storage capacitor electrode 223, and parts of the substrate 21 that is not covered by the gate electrode 221, the gate line 222, and the first storage capacitor electrode 223. The semiconductor island 263 is stacked on the gate electrode 221 via the insulating layer 23. The source electrode 261 and the drain electrode 262 are disposed on the semiconductor island 263, with the channel 241 located between the source electrode 261 and the drain electrode 262 and aligning to the gate electrode 221. The passivation layer 28 is disposed on the source, drain electrodes 261, 262, the channel 241 of the semiconductor island 263 located between the source, drain electrodes 261, 262, and the insulating layer 23, and includes vias 281 through the passivation layer 28. The electrical connections 29A are disposed on the passivation layer 28 and in the vias 281 and are connected the source, drain electrodes 261, 262, the gate line 222 to an external circuit (not shown) via the vias 281. The second storage capacitor electrode 29B is stacked on the first storage capacitor electrode 223.

The gate electrode 221, the insulating layer 23, the semiconductor island 263, and the source, drain electrodes 261, 262 cooperatively define the metal oxide TFT device 4. The metal oxide TFT device 4 may further includes the passivation layer 28 and the electrical connections 29A. The second storage capacitor electrode 29B, the first storage capacitor electrode 223, and the passivation layer 28, the insulating layer 23 located between the second storage capacitor electrode 29B and the first storage capacitor electrode 223 cooperatively defines the storage capacitor 5.

In alternative embodiments, an electrode contact layer 27 may be disposed between the semiconductor island 263 and the source, drain electrodes 261, 262, to reduce a contact resistance and increase a carrier injection efficiency, and thus, electrical characteristics of the pixel circuit are improved.

Furthermore, the source, drain electrodes 261, 262, and the channel 241 are formed in a self-alignment manner using the gate electrode 221 as photomasks, therefore, not only a misalignment offset between the gate electrode 221 and the source, drain electrodes 261, 262 becomes small, but also a sum of widths of overlapping regions between the gate electrode 221 and the source, drain electrodes 261, 262 may be reduced to less than 2 μm. Accordingly, parasitic capacitances respectively generated between the gate electrode 221 and the source, drain electrodes 261, 262 are effectively reduced, thereby improving a performance of the pixel circuit 3.

It should be understood that the pixel circuit 3 including the metal oxide TFT 4 and the storage capacitor 5 may also include other functional structures which are not described in the present disclosure, and all pixel circuits manufactured through the above-mentioned method fall within the protection scope of the present disclosure.

The foregoing descriptions are merely exemplary embodiments of the disclosure, but are not intended to limit the disclosure. Any modification, equivalent replacement, or improvement made without departing from the spirit and principle of the disclosure shall fall within the protection scope of the disclosure.

What is claimed is:

1. A method for manufacturing a pixel circuit, comprising:
   selecting a substrate and forming a gate, a gate line, and a first storage capacitor electrode on a first side of the substrate;
   sequentially depositing an insulating layer, a metal oxide semiconductor layer, and a photoresist layer on the gate electrode, the gate line, the first storage capacitor electrode, and the first side of the substrate;
   using the gate electrode, the gate line, and the first storage capacitor electrode as photomasks, exposing from a second side of the substrate that opposes to the first side, and reserving parts of the photoresist layer that align to the gate electrode, the gate line, and the first storage capacitor electrode;
   depositing an electrode layer on the metal oxide semiconductor layer and the reserved photoresist layer;
   stripping the reserved photoresist layer and lifting off parts of the electrode layer that are stacked on the reserved photoresist layer, so as to expose parts of the metal oxide semiconductor layer that align to the gate electrode, the gate line, and the first storage capacitor electrode, and reserving other parts of the electrode layer; and
   etching a part of the reserved electrode layer and the metal oxide semiconductor layer, and forming a source electrode, a drain electrode, and a metal oxide semiconductor island.

2. The method of claim 1, wherein the step of depositing an electrode layer on the semiconductor layer and the reserved photoresist layer comprises:
   depositing an electrode contact layer on the semiconductor layer and the reserved photoresist layer; and
   depositing the electrode layer on the electrode contact layer.

3. The method of claim 1, further comprising:
depositing a passivation layer on the source, drain electrodes, the channel, and the insulating layer, and forming vias through the passivation layer to the source and drain electrodes, and the gate line.

4. The method of claim 3, further comprising:
depositing a conductive layer on the passivation layer and in the vias, and etching a part of the conductive layer to form a second storage capacitor electrode stacked on the first storage capacitor electrode via the insulating layer and the passivation layer, and form electrical connections respectively connected to the source, drain electrodes, and the gate line.

* * * * *